(12) United States Patent
Chang

(10) Patent No.: US 8,570,103 B2
(45) Date of Patent: Oct. 29, 2013

(54) FLEXIBLE MULTI-CHANNEL AMPLIFIERS VIA WAVEFRONT MUXING TECHNIQUES

(75) Inventor: Donald C. D. Chang, Thousand Oaks, CA (US)

(73) Assignee: Donald C. D. Chang, Thousand Oaks ( * ) Notice: Subject to any disclaimer, the term of this patent is extended or adjusted under 35 U.S.C. 154(b) by 69 days.

(21) Appl. No.: 13/180,826

(22) Filed: Jul. 12, 2011

(65) Prior Publication Data
US 2012/0319772 A1    Dec. 20, 2012

Related U.S. Application Data

(60) Provisional application No. 61/497,852, filed on Jun. 16, 2011.

(51) Int. Cl.
*H03F 3/68* (2006.01)
(52) U.S. Cl.
USPC .................................... 330/124 R; 330/295
(58) Field of Classification Search
USPC ........................................ 330/124 R, 84, 295
See application file for complete search history.

(56) References Cited

U.S. PATENT DOCUMENTS

| | | | |
|---|---|---|---|
| 5,675,285 A * | 10/1997 | Winters ..................... | 330/124 R |
| 6,006,111 A * | 12/1999 | Rowland ..................... | 455/561 |
| 6,456,824 B1 | 9/2002 | Butte et al. | |
| 2011/0267141 A1* | 11/2011 | Hangai et al. .................. | 330/84 |

FOREIGN PATENT DOCUMENTS

JP    401022103 A  *  1/1989

OTHER PUBLICATIONS

U.S. Appl. No. 12/462,145, filed Jul. 30, 2009, Chang.
U.S. Appl. No. 12/122,462, filed May 16, 2008, Chang.
U.S. Appl. No. 12/847,997, filed Jul. 30, 2010, Lu et al.
U.S. Appl. No. 13/172,620, filed Jun. 29, 2011, Chang.
U.S. Appl. No. 12/848,953, filed Aug. 2, 2010, Chang et al.

* cited by examiner

*Primary Examiner* — Robert Pascal
*Assistant Examiner* — Khiem Nguyen

(57) ABSTRACT

This invention aims to present a smart and dynamic power amplifier module that features both power combining and power sharing capabilities. The proposed flexible power amplifier (PA) module consists of a pre-processor, N PAs, and a post-processor. The pre-processor is an M-to-N wavefront (WF) multiplexer (muxer), while the post processor is a N-to-M WF de-multiplexer (demuxer), where N≥M≥2. Multiple independent signals can be concurrently amplified by a proposed multi-channel PA module with a fixed total power output, while individual signal channel outputs feature different power intensities with no signal couplings among the individual signals. In addition to basic configurations, some modules can be configured to feature both functions of parallel power amplifiers and also as M-to-M switches. Other programmable features include configurations of power combining and power redistribution functions with a prescribed amplitude and phase distributions, as well as high power PA with a linearizer.

23 Claims, 10 Drawing Sheets

Multi-channel Power Amplifiers
WF muxed (Baseband inputs)

FLEXIBLE MULTI-CHANNEL AMPLIFIERS VIA WAVEFRONT MUXING TECHNIQUES

RELATED APPLICATION DATA

This application claims the benefit, pursuant to 35 U.S.C. §119(e), of U.S. provisional application Ser. No. 61/497,852, filed Jun. 16, 2011.

BACKGROUND OF THE INVENTION

1. Field of the Invention

The present invention relates to applications of resource sharing among multiple channel signals via wavefront (WF) multiplex (mux) and de-multiplex (demux) techniques. More specifically, the present invention discloses methods and applications for sharing a bank of power amplifiers (PAs) for many independent signals via wavefront multiplexing and demuxing techniques. The increased flexibility of multiple-parallel PAs allowing increased design flexibility is but one of the many advantages of the present invention.

2. Description of Related Art

In the satellite communications industry, in-phase power combiners have been used extensively to coherently combine multiple amplifiers in order to gain enhanced power output [1]. However, these power combiners only work at a given frequency, thus limiting their flexibility when applications require such versatility. Additionally, there are satellite payload designs featuring RF power sharing among downlink spot beams that exhibit large disparities in traffic patterns [2]. This invention presents a smart and dynamic power amplifier module that features both power sharing and power combining capabilities.

WF muxing/demuxing techniques are powerful tools for path length equalizations among parallel paths/channels. SDS has applied these techniques for various applications; (1) Wireless power combining from multiple transponders from the same satellites and/or different transponding satellites [3], (2) back channel equalization for ground based beam forming process in satellite applications [4], (3) Distributed data storage [5], and (4) efficient accessing communications satellites by polarization-incompatible terminals [7].

Uniqueness Structures of the OWFDM for Power Amplifications

Our proposed OWFDM techniques will coherently spread an input signal into multiple channels with a unique phase distribution pattern, referred to as a wavefront (WF). An N-channel WF multiplexing (mux) processor can spread N independent signals into a bank of N parallel PAs. As a result, each of the input signals are concurrently propagating in multiple channels and are amplified by N individual PAs in a form of orthogonal signal structure in the selected N-dimensional domain. The generated orthogonality is among multiple wave-fronts (WFs). With N parallel propagating channels, there are N-orthogonal WFs available. Probing signal streams may be attached to one of them. The remaining WFs are available for various input signals.

Amplified signals originated from various input ports through various PAs arriving at a destination feature differential phase delays, Doppler drifts, and amplitude amplifications/attenuations. A post-amplification processing will be designed to equalize the differential phase delays among propagation paths, and differential amplifications among the PAs. Calibrations and equalizations may take advantage of embedded probe signals and iterative optimization loops. As a result of equalizations, the WFs become spatially orthogonal and the attached amplified signals can then be precisely reconstituted by a WF demuxer implemented by a RF Butler matrix.

SUMMARY OF THE INVENTION

The present invention pertains to methods of RF (radio frequency) power amplification through a bank of parallel power amplifiers (PAs) for multiple RF signals. More specifically, the present invention comprises of a pre-processor to dynamically perform spatial multiplexing of multiple input signals, a bank of parallel PAs, and a post processor to de-multiplex the amplified signals. As a result, each PA amplifies an aggregated signal consisting of all input signals. Similarly, each of the input signals appears in all PAs. This method and apparatus are for dynamically sharing aggregated resources of "power amplifications" among multiple RF signals.

The concept of a virtual amplifier concurrently utilizes N amplification and propagation paths organized by the Wave-front (WF) Multiplexing (Muxing) process. Each propagating path features an independent power amplifier. A WF carrying a signal stream features a fixed spatial phase distribution among selected N parallel paths, which support up to N orthogonal WFs carrying N independent signals concurrently from various input ports to designated output ports. Each PA amplifies all the N signals, and each input signal appears in every PA. The parallel "processing" techniques are referred to as Orthogonal Wave-Front Diversity Multiplex (OWFDM), and the enabling processing structures as OWFDM processors.

The present invention allows multiple independent signals to be concurrently amplified by a proposed multi-channel PA module with a fixed total power output, while individual signal channel outputs feature different power intensities with no signal couplings among the individual signals. The following are some examples of applications.

An alternative embodiment relates to MIMO antenna designs. In conventional MIMO designs, each individual MIMO element has a dedicated power amplifier. For example, there will be 4 identical PAs with 250 mW each for 4-element designs. On the other hand, as an example, a proposed 4-to-4 flexible PA module consists of a bank of eight 150 mW PAs, which can not only support 4-antenna-element MIMO system designs, but also 3-element and 2-element MIMO designs, as long as total power output does not exceed 1 W. Additionally, the power output ratios among the element signals are immaterial. Furthermore, the same amplifiers may be individually used as single channel 1 W amplifiers.

Another alternative embodiment relates to portable electronic devices. Instead of employing multiple individual PAs as in a handset or a laptop, a proposed 4-to-4 PA module may concurrently support up-to 4 different wireless channels featuring individual antennas—two for Wi-Fi and two for Bluetooth, all in the 2.4 GHz ISM band. Thus, the RF power resources in the ISM band in a handset or a laptop are shared among the four antennas.

Yet another alternative embodiment relates applications for flexible multi-channel PA modules in base station and cell tower design. Many cell towers currently feature multiple coverage segments for frequency re-use. Individual segments are covered by separated antennas or common antennas with different I/O ports for various coverage segments. Individual segments are illuminated by dedicated power amplifiers, and are therefore sized according to individual maximum power requirements. On the other hand, the proposed flexible multi-channel PA module can concurrently support power-amplification of many independent radiated signals into various individual coverage segments. The availability of flexible multi-channel PA modules enables operators to size the PA requirements according to averaged power requirements among aggregated coverage areas instead of the maximum power requirements for each individual coverage segment. The resource-sharing feature of the present invention enables cell-networks to operate more efficiently and with more flexibility.

Yet another alternative embodiment relates to designs can be used for active phased array transmit antennas with amplitude tapers over an aperture. Conventionally, each array element in a phase array is supported by a dedicated power amplifier (PA). However, due to amplitude tapers that may feature output power differentials as high as >10 dB supporting low sidelobe performances, different grades of amplifiers are customized to a specified amplitude taper. While many multi-mission arrays feature various aperture tapes optimized for different applications, the conventional design approach will compromise their power efficiencies. On the other hand, the proposed multi-channel PA modules with fixed total power outputs can be used to support a variety of amplitude tapers across entire apertures, while maintaining high power efficiency. An entire active aperture can be implemented by identical flexible multi-channel PA modules.

Another embodiment of the present invention is programmable active switches. Some versions of flexible PA modules feature the capability to switch signals for one input after full amplification to any one of N outputs. The PA modules have the capability to switch two independent signals connected to two inputs after full amplification to any two of N outputs. They may also switch M inputs after full amplification to M of the N outputs, where M≤N.

Another embodiment of the present invention pertains to applications in programmable active distribution networks. The multi-channel PA modules have the capability to distribute one-input after full amplification to M of N outputs with specified amplitude and phase distributions, where M≤N. Two (or M) inputs, after full amplification, may be distributed to two (or M) of the N outputs with individually specified amplitude and phase distributions.

REFERENCES

1. "Novel Broadband Wilkinson Power Combiner," by Wentzel, A.; Subramanian, V.; Sayed, A.; Boeck, G.; pp 212-215, Journal of Microwave Conference, 2006. 36th European, at Manchester Issue Date: 10-15 Sep. 2006.
2. U.S. Pat. No. 6,456,824; "Satellite communication system using RF power sharing for multiple feeds or beams in downlinks," by Butte; Eric G., and Tyner; Randall D.; issued on Sep. 24, 2002
3. U.S. patent application Ser. No. 12/462,145; "Communication System for Dynamically Combining Power from a Plaurality of Propagation Channels in order to Improve Power Levels of Transmitted Signals without Affecting Receiver and Propagation Segments," by D. Chang, initial filing on Jul. 30, 2009.
4. U.S. patent application Ser. No. 12/122,462; "Apparatus and Method for Remote Beam Forming for Satellite Broadcasting Systems," by Donald C. D. Chang; initial filing May 16, 2008.
5. U.S. patent applications Ser. No. 12/848,953; "Novel Karaoke and Multi-Channel Data Recording/Transmission Techniques via Wavefront Multiplexing and Demultiplexing," by Donald C. D. Chang, and Steve Chen, Filing on Aug. 2, 2010
6. U.S. patent applications Ser. No. 12/847,997; "Polarization Re-alignment for Mobile Satellite Terminals," by Frank Lu, Yulan Sun, and Donald C. D. Chang; Filing on Jul. 30, 2010
7. U.S. patent applications Ser. No. 13/172,620; "Accessing LP Transponders with CP Terminals via Wavefront Multiplexing Techniques," by Donald C. D. Chang; Filing on Jun. 29, 2011

DETAILED DESCRIPTION OF THE PREFERRED EMBODIMENT

Figure 1:
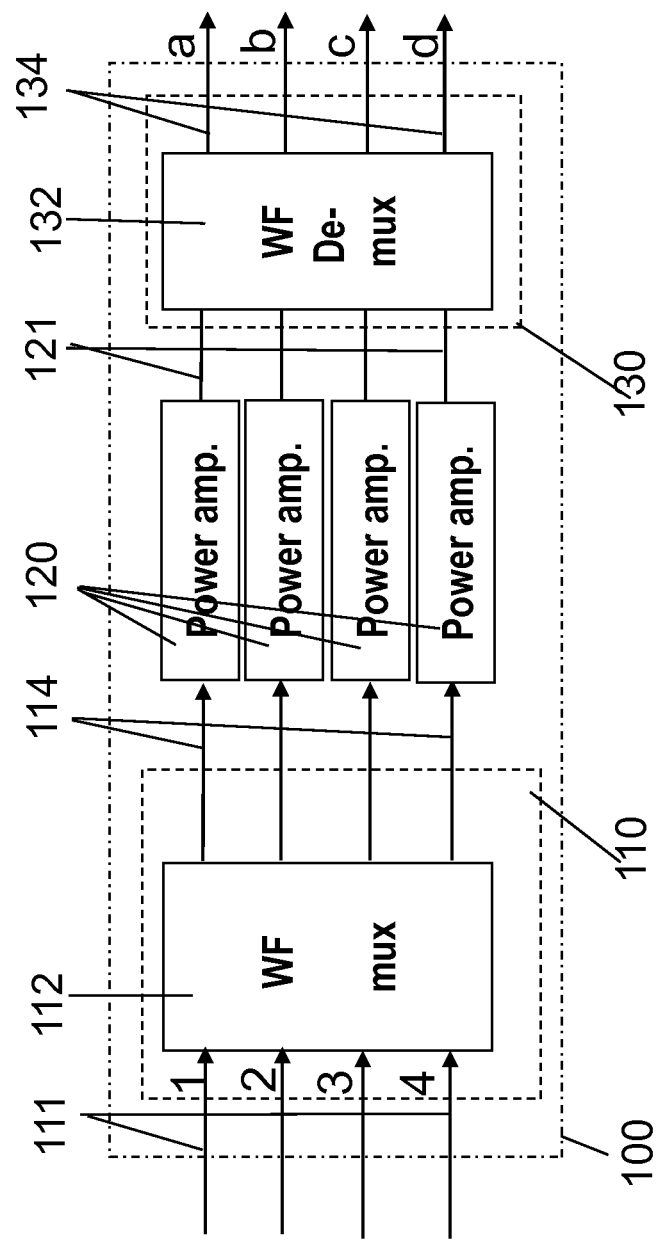
FIG. 1 depicts a simplified block diagram of a bank of 4 power amplifiers (PAs) interconnected by a pre-processor and a post-processor. The pre-processor is a 4-to-4 wavefront (WF) multiplexer (muxer) and the post processor is a 4-to-4 WF de-multiplexer (demuxer).

FIG. 1 100 depicts a simplified block diagram of a bank of 4 RF power amplifiers (PAs) 120 interconnected with RF pre-processor 110 and RF post-processor 130. Pre-processor 110 consists of 4-to-4 wavefront (WF) multiplexer (muxer) 112, and post-processor 130 consists of 4-to-4 WF de-multiplexer (demuxer) 132. Inputs 111 to WF muxer 112 are indicated as ports 1, 2, 3, and 4, respectively. Outputs 114 are connected to the 4 individual inputs 120 individually. Outputs 121 of PAs 120 become the inputs to 4-to-4 WF demux processor 132. Outputs 134 from WF demuxer 132 are depicted as ports a, b, c, and d, respectively.

The WF muxing/demuxing process feature N parallel propagation paths for M concurrently propagating waves from a source location to a destination. Each wave carries a communications signal stream. As a result of WF mux processing, each propagating wave with its signal stream appears in all (N) parallel paths with unique propagating wavefront (WF) at the destination. Furthermore, the same N parallel propagation paths support other signal streams "attached" to various WFs. For N-parallel paths, a WF is a vector in an N-dimensional space. There are N orthogonal WFs in the N-dimensional space. On the other hand, all M signals at the same frequency band may propagate through parallel paths concurrently. M number of completely uncorrelated signal streams are aggregated in each path.

Luneburg lens, Butler Matrices, and Pillboxes are analogue multiple beam beam-forming devices and can be used as WF muxers and demuxers. Other digital devices may also function efficiently as WF muxers and demuxers, such as 1-D or 2-D Fast Fourier Transform (FFT), 1-D or 2-D Discrete Fourier Transform (DFT), Hadamard transforms, Harley Transform (HT), or any combination thereof.

Let us define the following: (1) inputs to a WF muxing processor or outputs from a WF demuxing processor are referred to as "slices," and (2) outputs from a WF muxing processor or inputs to a WF demuxing processor are referred to as "wavefront components" (wfcs).

As depicted in FIG. 1, WF mux device 112 performs a "functional transformation", not in between time-and-frequency domains, but between space-and-wavefront domains. As result of 4-to-4 WF muxing 112, s1 signal stream connected to port 1 of the 4 inputs 111 will appear in y1, y2, y3, and y4 concurrently among the 4 output paths 114 but with unique phase distributions. The s1 stream in y2 is set at 45° (or $\pi/4$), phase-advanced with respect to (wrt) the propagation phase of the same s1 stream in y1. Concurrently, the s1 streams in y3 and y4 are respectively set at 90° (or $2\pi/4$), and 135° (or $3\pi/4$) phase-advanced wrt that in y1 path. The WF that the s1 signal stream attached to is expressed as WF1, where $$WF1=[\exp(j0),\exp(j\pi/4),\exp(j2\pi/4),\exp(j3\pi/4)] \quad (1.1)$$

More precisely, WF1 is associated with the input port 1 of the 4-to-4 WF Muxer 112, and s1($t$) data stream is attached to port 1. As a result of the WF muxing process, s1($t$) will flow out from output ports 114 concurrently with a unique propagating phase distribution, the WF vector WF1, which is time invariant.

Similarly the respective WF vectors associated to s2, s3, and s4 signals streams, which are inputs to Ports 2, 3, and 4 respectively, are WF2, WF3, and WF4, where $$WF2=[\exp(j0),\exp(j3\pi/4),\exp(j6\pi/4),\exp(j9\pi/4)] \quad (1.2)$$

$$WF3=[\exp(j0),\exp(j5\pi/4),\exp(j10\pi/4),\exp(j15\pi/4)] \quad (1.3)$$

$$WF4=[\exp(j0),\exp(j7\pi/4),\exp(j14\pi/4),\exp(j21\pi/4)] \quad (1.4)$$

In addition, (a) the 4 WF vectors in equation (1) are orthogonal to one another, and (b) the associated or attached signals streams are completely independent. These signals riding on the orthogonal WFs are fully recoverable by a WF demux processing which inherently performs the following "spatial" match filtering operations, where $$s1(t)=[y1,y2,y3,y4]*[\text{conj}(WF1)]^T, \quad (2.1)$$

$$s2(t)=[y1,y2,y3,y4]*[\text{conj}(WF2)]^T, \quad (2.2)$$

$$s3(t)=[y1,y2,y3,y4]*[\text{conj}(WF3)]^T, \quad (2.3)$$

$$s4(t)=[y1,y2,y3,y4]*[\text{conj}(WF4)]^T \quad (2.4)$$

It is necessary to calibrate and equalize the amplitude and phase differentials among the parallel signal paths due to both propagation and amplification effects As an example of two input signals, signal stream s1(*t*) connected to port 1 of 4 inputs 111 of the WF muxer 112 is spread into channels 114 with a unique spatial phase distribution, or a WF, while signal stream s3(*t*) connected to port 3 of the four inputs 111 is also divided into the same four channels 114 with another WF. These two WFs are orthogonal to one another. Each of the 4 channels 114 consists of two wavefront components, one from s1(*t*) and the other from s3(*t*). The 4 aggregated signals are individually amplified by the PAs 120. The amplified aggregated signals via parallel paths 121 are sent to the WF demux processor 132, which concurrently performs 4 spatial matched filtering. Since the two WFs are orthogonal, assuming fully equalized paths are, amplified signals s1(*t*) and s3(*t*) will flow out, respectively, from ports a and c of outputs 134 of the WF demuxer 132. There are no mutual couplings between the amplified signals.

Figure 2:
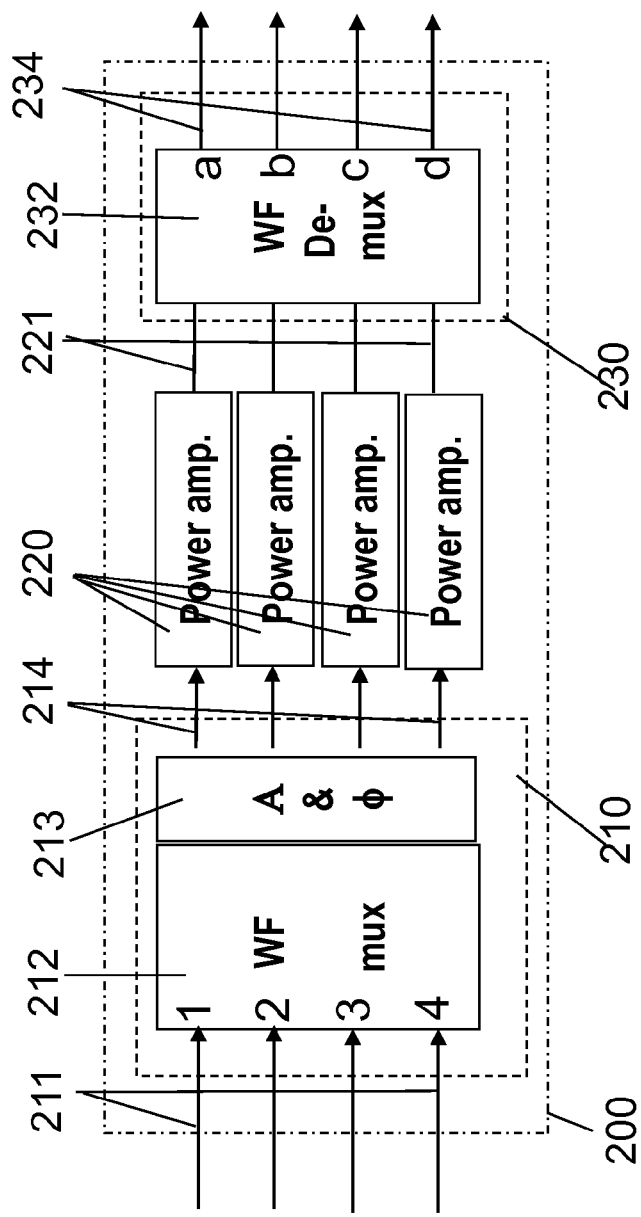
FIG. 2 depicts a simplified block diagram of a bank of 4 PAs interconnected by a pre-processor and a post-processor. The pre-processor consists of a 4-to-4 wavefront (WF) multiplexer (muxer) with compensation circuits for amplitude and phase differential equalization. The post processor is a 4-to-4 WF de-multiplexer (demuxer).

FIG. 2 200 depicts a simplified block diagram of a bank of RF power amplifiers 220 (PAs) interconnected with RF pre-processor 210 and RF post-processor 230. Pre-processor 210 is a 4-to-4 wavefront (WF) multiplexer (muxer) 212. Post-processor 230 is a 4-4 WF de-multiplexer (demuxer) 232. Inputs 211 to the WF muxer 212 are indicated as ports 1, 2, 3, and 4, respectively. Its four outputs are cascaded individually by RF phase and amplitude compensation circuits/mechanisms 213. Outputs 214 are connected to individual inputs of PAs 220 individually. Outputs 221 of PAs 220 become the inputs to 4-to-4 WF demux processor 232. Outputs 234 from the WF demuxer 232 are depicted as ports a, b, c, and d, respectively.

As an example of two RF input signals, signal stream s1(*t*) is connected to port 1 of the 4 inputs 211 of WF muxer 212 and is spread into 4 channels with a unique spatial phase distribution, or a WF. Signal stream s3(*t*) is connected to port 3 of inputs 211 and is also divided into the same four channels with another WF. These two WFs are orthogonal to one another. Each of the 4 channels consists of two wavefront components one from s1(*t*) and the other from s3(*t*). For pre-compensating for non-identical PAs, variable phase and amplitude mechanism circuits 213 are cascaded prior to outputs 214. The 4 aggregated signals are amplified by the 4 PAs 220 individually. The fully equalized, amplified, and aggregated signals via 4 parallel paths 221 are sent to WF demux processor 132, which concurrently performs 4 spatial matched filtering. Since the two WFs are orthogonal, due to fully equalized paths, amplified signals s1(*t*) and s3(*t*) will flow out, independently and respectively, from ports a and c of the 4 outputs 234 of the WF demuxer 232. There are no mutual couplings between the amplified signals.

Figure 2A:
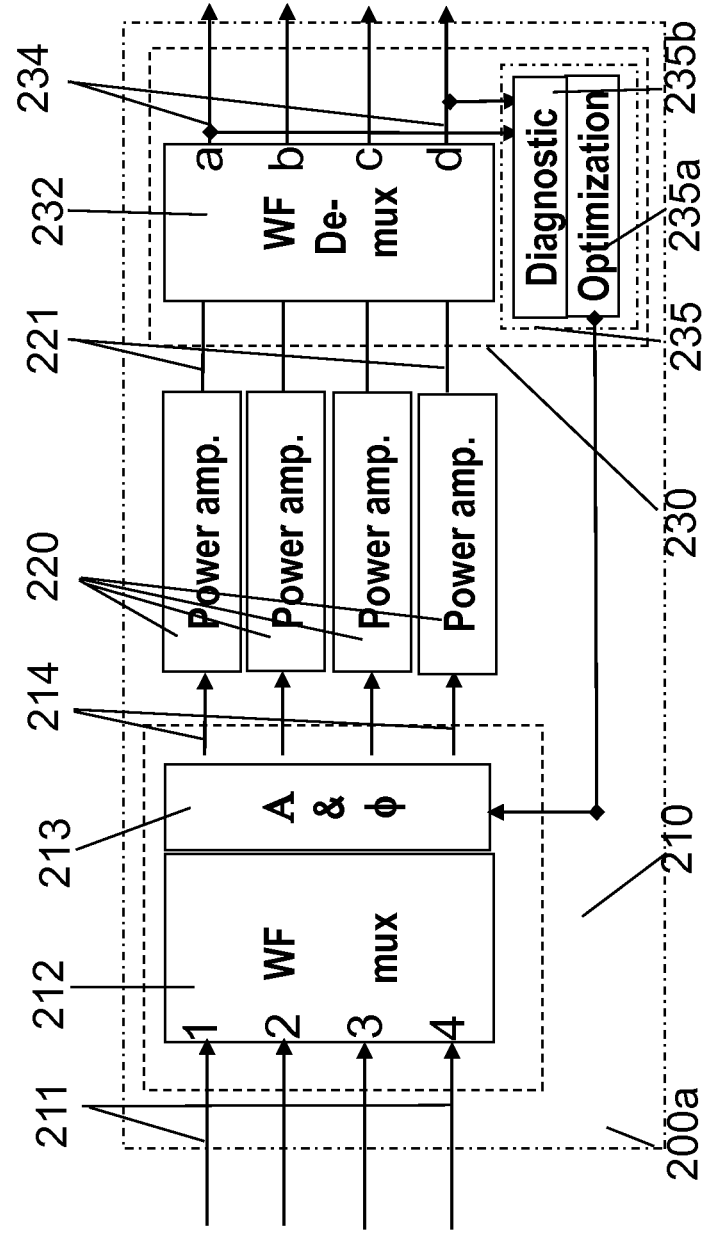
FIG. 2a illustrates a simplified block diagram of a bank of 4 PAs interconnected by a pre-processor, a post-processor and an optimization loop. The pre-processor consists of a 4-to-4 wavefront (WF) multiplexer (muxer) with compensation circuits for amplitude and phase differential equalization among the 4 PAs. The post-processor comprises is a 4-to-4 WF de-multiplexer (demuxer). The optimization loop utilizes the information derived from WF demuxer outputs for compensation circuit parameter alterations.

FIG. 2a 200a depicts a simplified block diagram of a bank of 4 RF power amplifiers 220 (PAs) interconnected by an RF preprocessor 210 and an RF post processor 230. The preprocessor is a 4-to-4 wavefront (WF) multiplexer (muxer) 212 and the post processor is a 4-4 WF de-multiplexer (demuxer) 232. The four inputs 211 to the WF mux 212 are indicated as ports 1, 2, 3, and 4 respectively. Its four outputs are cascaded individually by RF phase and amplitude compensation circuits/mechanisms 213, which are driven by an optimization loop. Their outputs 214 are connected to the 4 individual inputs of the PAs 220 individually. The outputs 221 of the 4 PAs 220 become the inputs to the 4-to-4 WF demux processor 232. The four outputs 234 from the WF demuxer are depicted as ports a, b, c, and d, respectively. The iterative equalization processor 235 consists of two functions; diagnostic 235a and optimization 235b. The outputs of the optimization process 235b will be the parameters for equalization circuits/mechanisms 213 in next updates. The 4 outputs 234 are used as diagnostic signals for the evaluations of whether the 4 propagation paths are equalized in amplitudes and phases, and the optimization process generates the new parameters for the RF phase and amplitude compensations circuits/mechanisms 213.

As an example of two input signals, a signal stream s1(*t*) connected to port 1 of the 4 inputs 211 of the WF muxer 212 is spread into 4 channels with a unique spatial phase distribution, or a WF, while another signal stream s3(*t*) connected to port 3 of the four inputs 211 is also divided into the same four channels but with another WF. These two WFs are orthogonal to one another. Each of the 4 channels consists of two wavefront components one from s1(*t*) and the other from s3(*t*). For pre-compensating for non identical PAs 220, variable phase and amplitude circuits/mechanisms 213 are cascaded prior to the 4 outputs 214. The 4 aggregated signals are amplified by the 4 PAs 220 individually. At a steady state, the fully equalized and amplified aggregated signals via 4 parallel paths 221 are sent to the WF demux processor 132, which concurrently performs 4 spatial matched filtering. Since the two WFs are orthogonal, due to fully equalized paths, amplified signals s1(*t*) and s3(*t*) will flow out, independently and respectively, from ports a and c of outputs 234 of WF demuxer 232. There are no mutual couplings between the amplified signals. On the other hand, when the paths are not fully equalized, the two WFs are non-orthogonal to each other. There will be couplings among the amplified signals. Among many diagnostic techniques, cross correlations among the output signals at output ports 234 are used as performance indexes. When the 4 amplification paths are equalized and the WFs become orthogonal to one another, the cross-correlations among independent output signals will be minimized.

Figure 2B:
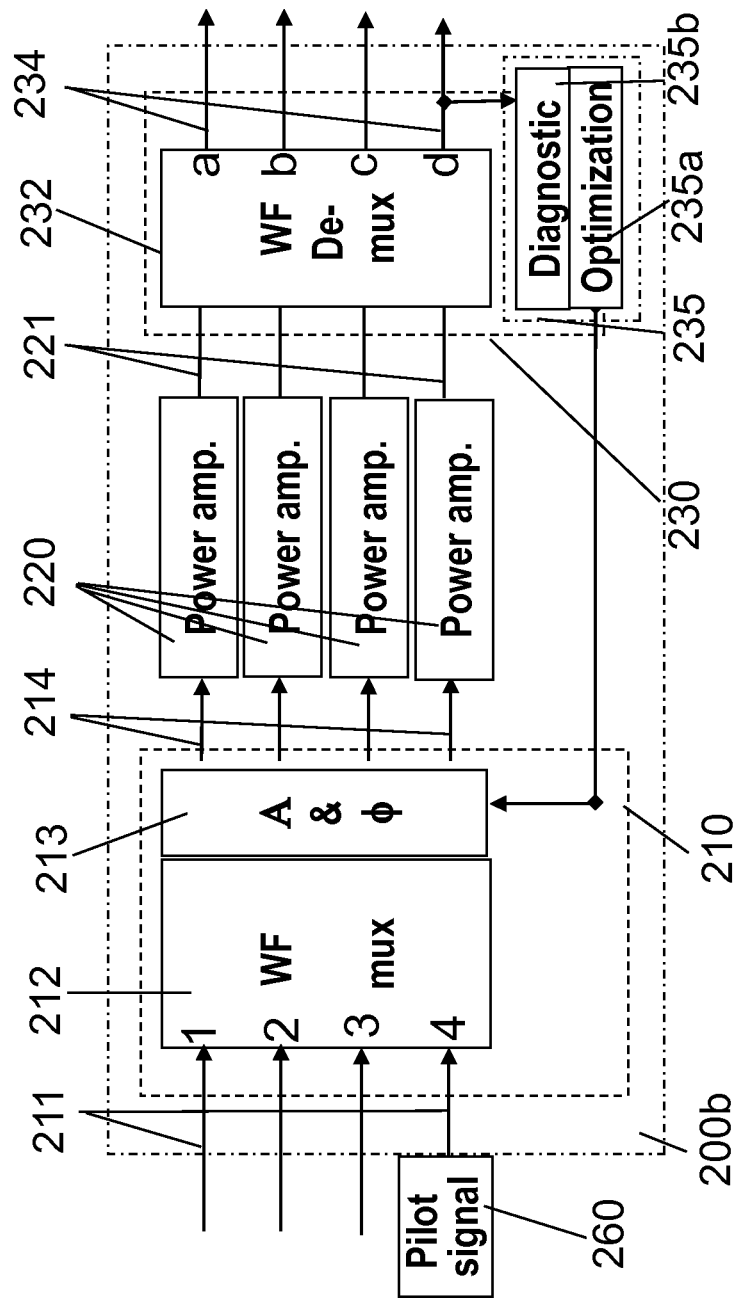
FIG. 2b illustrates a simplified block diagram of a bank of 4 PAs interconnected by a pre-processor, a post-processor and an optimization loop. The pre-processor consists of a 4-to-4 wavefront (WF) multiplexer (muxer) and additional compensation circuits for amplitude and phase differential equalization. One input to the WF muxer is reserved for dynamic probe signals. The post-processor comprises of a 4-to-4 WF de-multiplexer (demuxer). One of the WF demuxer outputs becomes the reserved output port (port d) for the probe signal. The optimization loop utilizes the information derived from the port d output of the WF demuxer for compensation circuit parameter alterations.

FIG. 2b 200b depicts a simplified block diagram of a bank of 4 RF power amplifiers 220 (PAs) interconnected with RF pre-processor 210 and RF post-processor 230. Pre-processor 210 is a 4-to-4 wavefront (WF) multiplexer (muxer) 212. Post-processor 230 is a 4-4 WF de-multiplexer (demuxer) 232. Inputs 211 to WF mux 212 are indicated as ports 1, 2, 3, and 4 respectively. Port 4 is dedicated to diagnostic purposes. Pilot signals 260 are injected at port 4. The four outputs are cascaded individually by RF phase and amplitude compensation circuits/mechanisms 213. Outputs 214 are connected to the 4 individual inputs of PAs 220. PA outputs 221 become the inputs to 4-to-4 WF demux processor 232. Outputs 234 from the WF demuxer are depicted as ports a, b, c, and d, respectively. Iterative equalization processor 235 consists of two functions; diagnostic 235a and optimization 235b. The outputs of optimization process 235b will be the parameters to be updated for equalization circuits/mechanisms 213 in cycle updates. Port d outputs 234 are the diagnostic signals for the evaluation of whether the 4 propagation paths are equalized in amplitudes and phases, while the optimization process generates the new parameters for phase and amplitude compensations circuits/mechanisms 213

As an example of two RF input signals, a signal stream s1(*t*) connected to port 1 of inputs 211 of WF muxer 212 is spread into 4 channels with a unique spatial phase distribution, or a WF. Signal stream s3(*t*), connected to port 3 of inputs 211, is also divided into the same four channels but with another WF. Concurrently the pilot signals on port 4 will also be embedded in the 4 aggregated signal paths with a third WF. These WFs are orthogonal to one another. Each of the 4 channels consists of three wavefront components one from s1(*t*), the second from s3(*t*), and a third from pilot signals 260. For pre-compensating for non identical PAs, variable phase and amplitude mechanism circuits 213 are cascaded prior to outputs 214. The 4 aggregated signals are amplified by PAs 220 individually. At a steady state, the fully equalized, amplified, and aggregated signals via parallel paths 221 are sent to WF demux processor 132, which concurrently perform 4 spatial matched filtering. Since the three WFs are orthogonal, due to fully equalized paths, amplified signals s1(t), and s3(t) will flow out, independently and respectively, from ports a and c of the 4 outputs 234 of WF demuxer 232. Similarly, the amplified pilot signals will appear at port d alone. There are no mutual couplings among the amplified signals. On the other hand, if the paths are not fully equalized, the three WFs are non orthogonal to each other. There will be couplings among the amplified signals. Among many diagnostic techniques, leakages of s1(t) and s3(t) at the 4 output ports 234 are used as performance indexes. When the 4 amplification paths are equalized and the WFs becoming orthogonal to one another, the cross-correlations among independent output signals will be minimized.

Figure 2C:
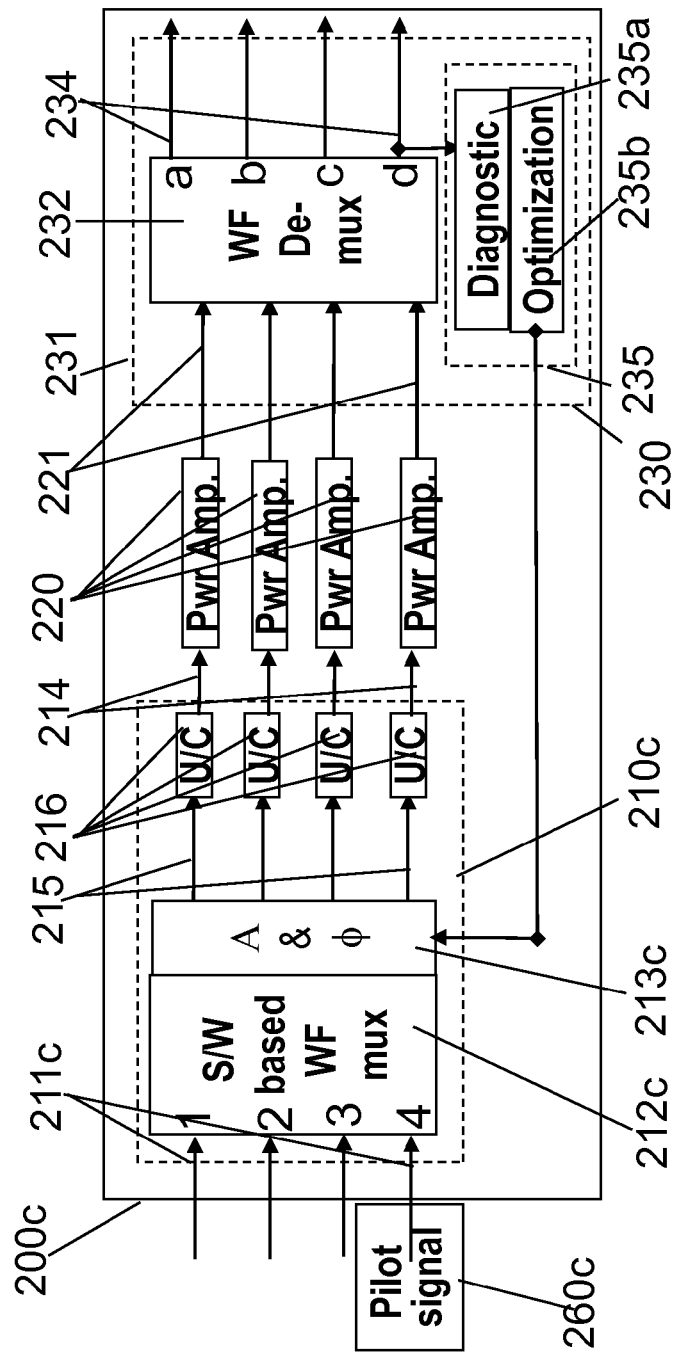
FIG. 2c illustrates a simplified block diagram of a bank of 4 PAs interconnected by a pre-processor, a post-processor and an optimization loop. The pre-processor implemented in base-band digital format consists of a 4-to-4 wavefront (WF) multiplexer (muxer) and additional compensation circuits for digital equalization of amplitude and phase differentials among the 4 PAs. One input port is reserved for dynamic probe signals. The following outputs are then converted to analog format, frequency up-converted to a specified frequency, then sent to the PAs. The post-processor comprises of a 4-to-4 WF de-multiplexer (demuxer). A WF demuxer output port is reserved for the probe signal. The optimization loop utilizes the data from the probe signal for compensation circuit parameter alteration.

FIG. 2c 200c depicts a simplified block diagram of a bank of 4 RF power amplifiers 220 (PAs) interconnected by a software-based baseband pre-processor 210c and RF post-processor 230. Pre-processor 210c performs 4-to-4 wavefront (WF) multiplex (mux) functions 212c. RF post-processor 232 is a 4-to-4 WF de-multiplexer (demuxer) 232. Base-band digital inputs 211c to WF muxer 212c are indicated as ports 1, 2, 3, and 4, respectively. One of them, port 4, is dedicated to diagnostic purposes. Baseband pilot signals 260c are injected at port 4. The functions of phase and amplitude compensation circuits/mechanisms 213c are implemented digitally in baseband. Outputs 215 are converted to analogue formats and frequency up-converted 216. Outputs 214 consist of up-converted pre-processed RF signals. They are then connected to individual inputs of the PAs 220. PA outputs 221 become the inputs to the 4-to-4 WF demux processor 232. Outputs 234 from the WF demuxer are depicted as ports a, b, c, and d, respectively. Iterative equalization processor 235 consists of two functions, diagnostics 235a and optimization processor 235b. Outputs of the optimization process 235b will be the parameters to be updated for equalization circuits/mechanisms 213c in the upcoming cycle updates. Outputs 234 are the diagnostic signals for the evaluations of whether the 4 propagation paths are equalized in amplitudes and phases, and the optimization process generates the new parameters for phase and amplitude compensations circuits/mechanisms 213c

As an example of two RF input signals, a signal stream s1(t) connected to port 1 of the 4 inputs 211c of the WF muxer 212c is spread into 4 channels with a unique spatial phase distribution, or a WF, while another signal stream s3(t) connected to port 3 of the four inputs 211c is also divided into the same four channels but with another WF. Concurrently a baseband pilot signal stream on port 4 will also be embedded in the 4 aggregated signal paths with a third WF. These WFs are orthogonal to one another. Each of the 4 channels consists of three wavefront components one from s1(t), the second from s3(t), and a third from pilot signals. For pre-compensating for non-identical PAs, variable phase and amplitude mechanism circuits 213 are cascaded prior to 4 outputs 215. The 4 aggregated signals before the pre-compensation has are x1, x2, x3, and x4, where $$x1(t)=c11*s1(t)+c13*s3(t)+c14*p(t) \quad (3a)$$

$$x2(t)=c21*s1(t)+c23*s3(t)+c24*p(t) \quad (3b)$$

$$x3(t)=c31*s1(t)+c33*s3(t)+c34*p(t) \quad (3c)$$

$$x4(t)=c41*s1(t)+c43*s3(t)+c44*p(t) \quad (3d)$$

It can be written as $$[X]=[C][S] \quad (4)$$

where, $[X]^T=[x1(t)\ x2(t)\ x3(t)\ x4(t)]$ and $[S]^T=[s1(t)\ 0\ s3(t)\ p(t)]$, and $$[C] = \begin{pmatrix} c11 & c12 & c13 & c14 \\ c21 & c22 & c23 & c24 \\ c31 & c32 & c33 & c34 \\ c41 & c42 & c43 & c44 \end{pmatrix} \quad (5)$$

[C] is the functional transformation of a selected WF mux processing. The resulting orthogonal WFs are attached to various input signals. The WF for s1(t) is WF1 [, and those for s3(t) and p(t) are WF3, and WF4, respectively. where $$WF1=[c11\ c21\ c31\ c41], \quad (6a)$$

$$WF2=[c12\ c22\ c32\ c42], \quad (6b)$$

$$WF3=[c13\ c23\ c33\ c43], \text{ and} \quad (6c)$$

$$WF4=[c14\ c24\ c34\ c44]. \quad (6d)$$

Furthermore, WF1, WF2, WF3, and WF4 are orthogonal to one another; or $$WFi \times [WFj]^{*T}=0, \text{ if } i \neq j \quad (7a)$$

$$WFi \times [WFi]^{*T}=\text{constant, for } i=1, 2, 3, \text{ and } 4 \quad (7b)$$

The outputs at 215 are converted to analogue formats, frequency up-converted by up-converters 216. The RF outputs 214 are 4 up-converted, pre-processed, and pre-compensated RF signals. The 4 RF signals are amplified by the 4 PAs 220 individually.

$$[Y(t)]=A\exp(j\omega t)[X(t)] \quad (8)$$

where A is the amplification factor of the 4 fully equalized and compensated PAs. [Y(t)] represents [y1(t), y2(t), y3(t), y4(t)], $$y1(t)=A\exp(j\omega t)x1(t) \quad (8a)$$

$$y2(t)=A\exp(j\omega t)x2(t) \quad (8b)$$

$$y3(t)=A\exp(j\omega t)x3(t) \quad (8c)$$

$$y4(t)=A\exp(j\omega t)x4(t) \quad (8d)$$

At a steady state, the fully equalized amplified aggregated signals [Y(t)] via 4 parallel paths 221 are sent to WF demux processor 232, which performs another functional transformation [D], where $$[Z(t)]=[D][Y(t)] \quad (9)$$

where $[Z(t)]^T=[za(t)\ zb(t)\ zc(t)\ zd(t)]$ is the output vectors consisting of the 4 outputs 234. The output signals [Z(t)] in Equation (9) can be represented in terms of input signals [S(t)] as $$[Z(t)]=[D]*A\exp(j\omega t)[X(t)]=A\exp(j\omega t)[D][C][S] \quad (10)$$

where [C] is the WF mux functional transform and [D] is the corresponding WF demux functional transformations. They are selected designs such that $$[D][C]=[I] \quad (11)$$

where [I] is the unity matrix. As a result, equation (10) can be written as $$[Z(t)]=[D]*A\exp(j\omega t)[X(t)]=A\exp(j\omega t)[S] \quad (12)$$

or $za(t)=As1(t)\exp(j\omega t)$ (12a)

$zb(t)=0$ (12b)

$zc(t)=As3(t)\exp(j\omega t)$ (12c)

$zd(t)=Ap(t)\exp(j\omega t)$ (12d)

Since the three WFs are orthogonal, due to fully equalized paths by pre-compensation circuits, amplified signals s1(t), and s3(t) at an RF carrier frequency will flow out, independently and respectively, from ports a and c of the 4 outputs 234 of WF demuxer 232. Similarly, the amplified pilot signals will appear at port d alone. There are no mutual couplings among the amplified signals.

On the other hand, when the paths are not fully equalized, the three WFs are non-orthogonal to each other. There will be couplings among the amplified signals. We take advantage of these observations in our equalization process. Among many diagnostic techniques, RF leakages of s1(t) and s3(t) at output ports 234 are used as performance indexes. When the 4 amplification paths are equalized and the WFs becoming orthogonal to one another, the cross-correlations among independent output signals will become negligibly small.

Mathematically, the WF muxing and demuxing processing are very similar to the digital forming processing for multiple simultaneous beams.

Figure 3:
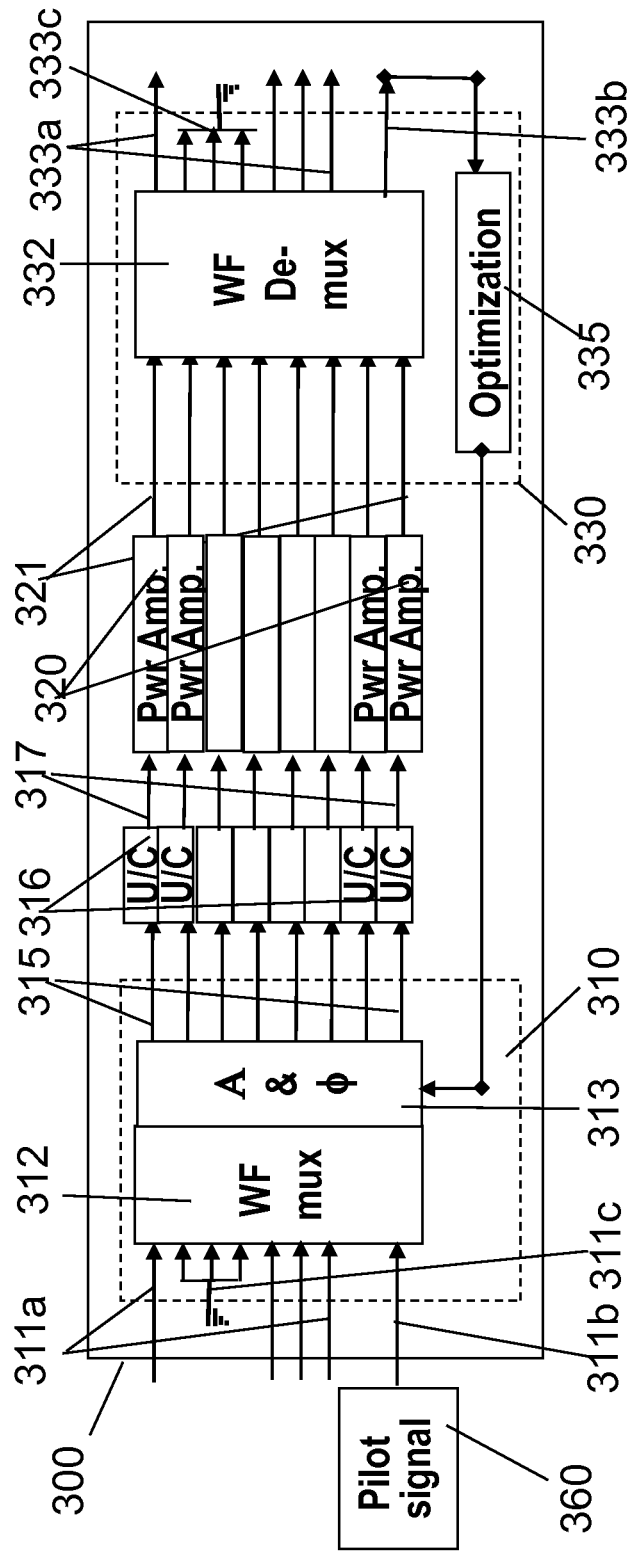
FIG. 3 illustrates a simplified block diagram of a bank of 8 PAs interconnected by a preprocessor, a post processor and an optimization loop. The preprocessor implemented in base-band digital format consists of an 8-to-8 wavefront (WF) multiplexer (muxer) and additional compensation circuits to digitally equalize the amplitude and phase differentials among the 8 PAs. Only 4 of the 8 input ports are reserved for signal amplifications applications. They are the ports 1, 5, 6, and 7. Port 8 is reserved for dynamic probing signals also formulated digitally in baseband. The outputs of the compensation circuits are converted to analogue formats, frequency up-converted to a designated RF frequency band before sent to the bank of 8 PAs, The post processor comprises is an 8-to-8 WF de-multiplexer (demuxer). One of the WF demuxer outputs becomes the reserved output port (port h) for probing signal. The optimization loop utilizes the information derived from the port h outputs of the WF demuxer to alter the parameters in the compensation circuits equalizing the amplitude and phase differentials among the 8 PAs.

FIG. 3 300 depicts a simplified block diagram of a bank of 8 RF power amplifiers 320 (PAs) interconnected with software-based baseband pre-processor 310 and an RF post-processor 330. Digital baseband preprocessor 310 performs 8-to-8 wavefront (WF) multiplex (mux) functions 312. RF post-processor 330 is an 8-to-8 WF de-multiplexer (demuxer) 332. Base-band digital input ports 311 are grouped into three categories: RF signal input ports 311a, probing signal ports 311b, and unused ports 311c. The sequence of 8 port numbers, not shown, starts from the top to the bottom. As depicted, ports 1, 5, 6, and 7 are for RF input signals to the WF mux 313, ports 2, 3, and 4 are unused, and port 8 is dedicated for probing signals. Baseband pilot signals 360 may be injected at port 8. The functions of phase and amplitude compensation circuits/mechanisms 313 are digitally implemented in baseband. Their outputs are converted to analogue formats and frequency up-converted 316. Outputs 317 are 8 up-converted pre-processed RF signals. They are then connected to the 8 individual inputs of PAs 320. PA outputs 321 become the inputs to 8-to-8 WF demux processor 332. The eight outputs 333 from the WF demuxer as depicted also are categorized into three groups. The port sequence not shown is from top to bottom. The 1$^{st}$ is port-a, 2$^{nd}$ is port-b, 3$^{rd}$ is port-c, etc. As depicted, ports a, e, f, and g 333a are for amplified signals. Port, b, c, and d 333c are not used, and port h 333b is dedicated for receiving probing signals. Iterative equalization processor 335 consists of two functions: diagnostic function 335a and optimization function 335b. Outputs of the optimization process 335b will serve as parameters to be updated for equalization circuits/mechanisms 313 in next updates. Port h outputs 333b are the diagnostic signals for the evaluations of whether the 8 propagation paths are amplitude and phase equalized, and the optimization process generates the new parameters for phase and amplitude compensations circuits/mechanisms 313.

Figure 4:
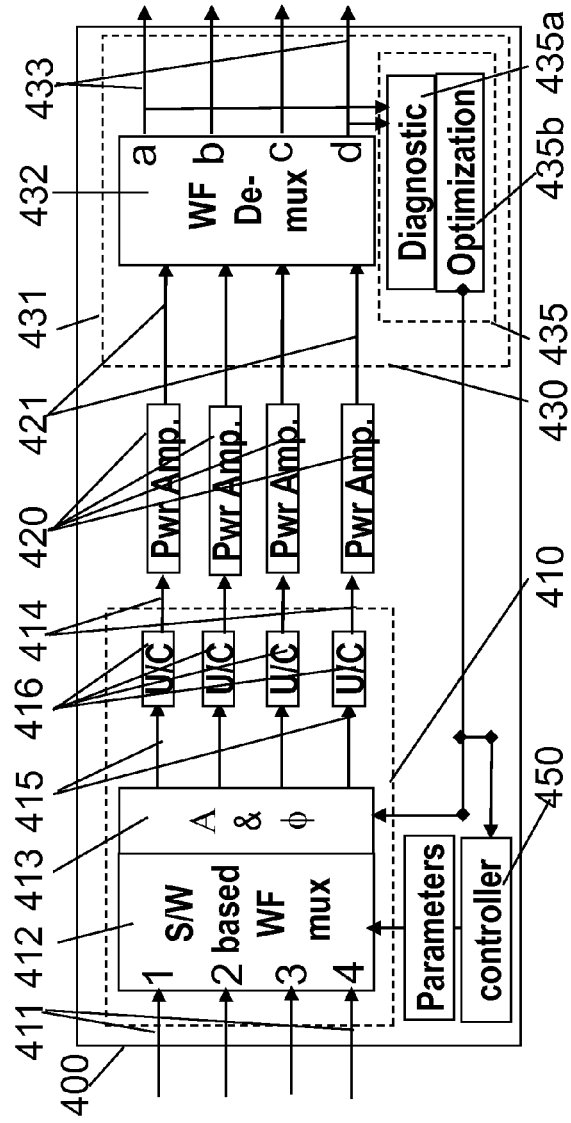
FIG. 4 illustrates a simplified block diagram of a bank of 4 PAs interconnected by a programmable pre-processor and a post-processor. The pre-processor, implemented in baseband digital format, consists of a programmable 4-to-4 wavefront (WF) multiplexer (muxer) and additional compensation circuits for digital equalization of amplitude and phase differentials among the 4 PAs. The outputs of the compensation circuits are converted to analogue formats, frequency up-converted to a designated RF frequency band before sent to the bank of 4 PAs. The post processor comprises is a 4-to-4 WF de-multiplexer (demuxer). The programmability of the WF muxer are through alternations of its functional parameters by a controller unit.

FIG. 4 depicts a simplified block diagram 400 of a bank of 4 RF power amplifiers 420 (PAs) interconnected with software-based programmable pre-processor 410 and fixed RF post-processor 430. Digital pre-processor 410 performs wavefront (WF) multiplex (mux) functions 412 concurrently or alternately. RF post-processor 430 is a fixed 4-to-4 WF de-multiplexer (demuxer) 432. The four digital inputs 411 to WF mux 412 are indicated as ports 1, 2, 3, and 4, respectively. Any one of them can be used for on-demand diagnostics. The functions of phase and amplitude compensation circuits/mechanisms 413 are digitally implemented in baseband. Outputs 415 are converted to analogue formats and frequency up-converted 416. Outputs 414 are 4 up-converted pre-processed RF signals. They are connected to the 4 individual inputs of the PAs 420. PA outputs 421 become the inputs to the 4-to-4 WF demux processor 432. The four outputs 433 from the WF demuxer are depicted as ports a, b, c, and d, respectively. Iterative equalization processor 435 consists of two functions: diagnostic function 435a and optimization function 435b. Outputs of the optimization process 435b will provide the parameters to be updated for equalization circuits/mechanisms 413 in following clock cycle updates. Outputs 433 may all be used as the diagnostic signals for the evaluations of whether the 4 propagation paths are equalized in amplitudes and phases, and the optimization process generates the new parameters for phase and amplitude compensations circuits/mechanisms 413

Configuration shown in FIG. 4 features a fixed WF demux and programmable WF muxing processor. It can be programmed to perform not only power amplification via distributed PAs but also with switching functions directing input signals to various output ports. It may be programmed to feature not only power amplifications via distributed PAs but also capability to distribute amplified signals to multiple output ports with fixable amplitude and phase distributions. It may be programmed as active (phased) power combiners. We will show how it works as a 1-to-3 active switch and a 2-to-2 active switch Example of a 2-to-4 Active Switch As an example for switching functions of two RF input signals, signal stream s1(t) is connected to port 1 of inputs 411 of the WF muxer 412 and is spread into 4 channels with a unique spatial phase distribution, or a WF, while another signal stream s3(t) connected to port 3 of inputs 411 and is also divided into the same four channels but with another WF. Similar to operational scenarios in FIG. 2c, as a conventional distributed amplifier, s1(t) signals from port 1 are amplified and output at port a, and concurrently s3(t) signals from port 3 are amplified and delivered to port 3 as expected. p(t) will consume only <0.1% of the total output power.

As a switching device, the output ports for s1(t) and s3(t) can be interchanged by altering parameters in the [C] matrix in equation (5). The coefficients in the first and the third columns are flipped via a stroke on a computer keyboard. The altered matrix [Cx] will feature;

$$[Cx] = \begin{pmatrix} c13 & c12 & c11 & c14 \\ c22 & c22 & c21 & c24 \\ c33 & c32 & c31 & c34 \\ c43 & c42 & c43 & c44 \end{pmatrix}$$ (13)

and the associated aggregated signals become $x1'(t)=c13*s1(t)+c11*s3(t)+c14*p(t)$ (13a)

$x2'(t)=c23*s1(t)+c21*s3(t)+c24*p(t)$ (13b)

$x3'(t)=c33*s1(t)+c31*s3(t)+c34*p(t)$ (13c)

$x4'(t)=c43*s1(t)+c41*s3(t)+c44*p(t)$ (13d)

By re-programming the WF mux functions from [C] to [Cx], the altered module outputs [Z'(t)] with associate components become;

$$za'(t)=As3(t)\exp(j\omega t) \quad (14a)$$

$$zb'(t)=0 \quad (14b)$$

$$zc'(t)=As1(t)\exp(j\omega t) \quad (14c)$$

$$zd'(t)=Ap(t)\exp(j\omega t) \quad (14d)$$

There is no high power RF switching.

Similarly the WF mux functional matrix may also be altered again to [Cx1] to have all the RF power output dedicated to $s1(t)$, except <0.1% for probing signals, and the amplified $s1(t)$ delivered to output port-c;

$$[Cx1]=\begin{pmatrix} c13 & c12 & 0 & c14 \\ c23 & c22 & 0 & c24 \\ c33 & c32 & 0 & c34 \\ c43 & c42 & 0 & c44 \end{pmatrix} \quad (15)$$

As a reult, the aggregated signals before various PA channels become $$x1''(t)=c13*s1(t)+0*s3(t)+c14*p(t) \quad (15a)$$

$$x2''(t)=c23*s1(t)+0*s3(t)+c24*p(t) \quad (15b)$$

$$x3''(t)=c33*s1(t)+0*s3(t)+c34*p(t) \quad (15c)$$

$$x4''(t)=c43*s1(t)+0*s3(t)+c44*p(t) \quad (15d)$$

The corresponding module outputs [Z''(t)] will exhibit the following amplified signals:

$$za''(t)=0 \quad (16a)$$

$$zb''(t)=0 \quad (16b)$$

$$zc''(t)=As1(t)\exp(j\omega t) \quad (16c)$$

$$zd''(t)=Ap(t)\exp(j\omega t) \quad (16d)$$

In short, $s1(t)$ and $p(t)$ can be assigned to any of the 4 output ports dynamically.

Figure 5:
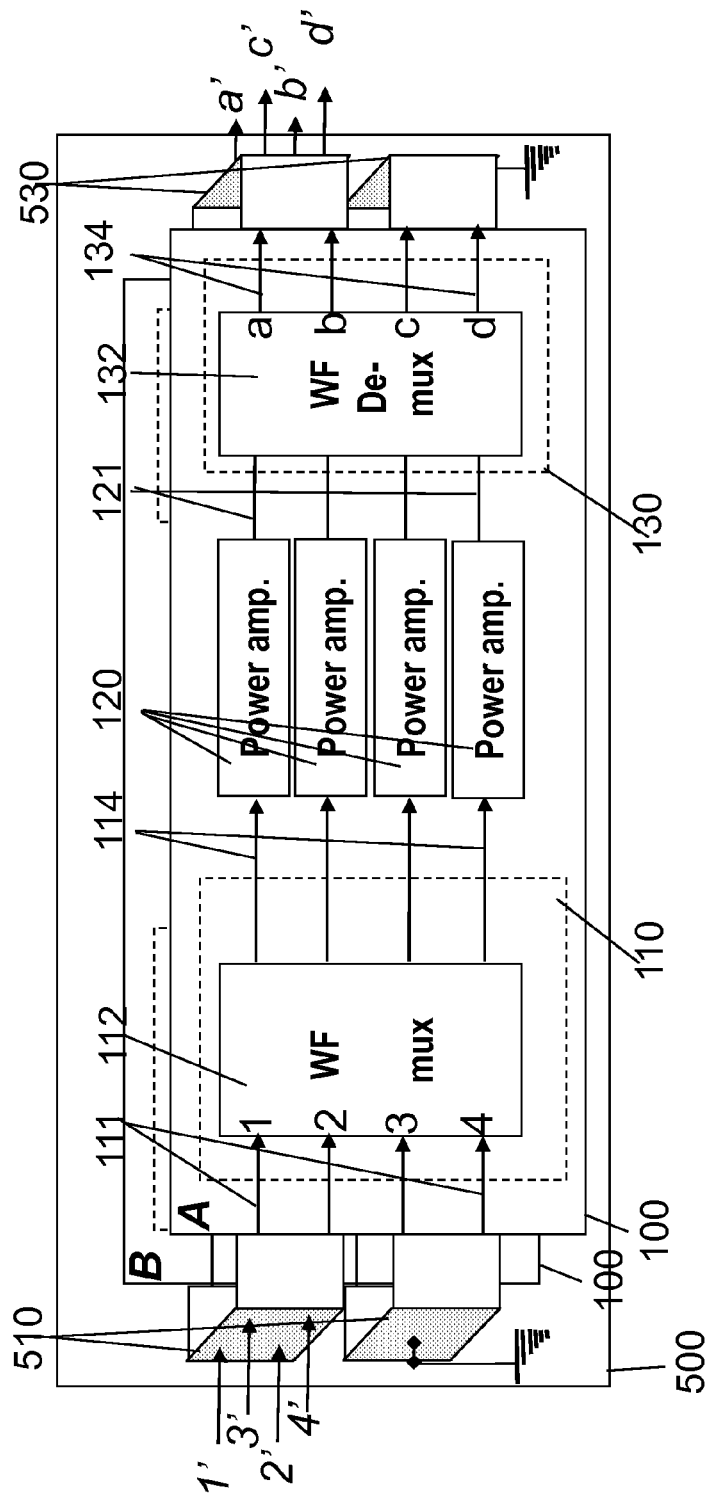
FIG. 5 illustrates a simplified block diagram of combining two 4-to-4 PA modules into an 8-to-8 PA module with nearly twice the total output power. The illustration depicts a configuration equivalent to a 4-to-4 PA module with twice the total output power as that of a single physical module. An additional pair of a WF muxer and a WF demuxer are used.

FIG. 5 500 depicts an embodiment utilizing a combination of two flexible PA modules for higher power output scenarios. This technique is not limited to two modules. The building blocks are the 4-to-4 module depicted in FIG. 1. There are two sets of 4 inputs and two sets of 4-outputs.

The second tier of WF muxing devices 510 are chosen to have a feature of 4-to-2*2, with 4 inputs and with 2*2 outputs. There are two independent sets. One set is used and the other set is grounded. Therefore, only 4 potential inputs are available to the combined module.

The associate WF demuxing devices 530 feature 2 sets of outputs each with a 2*2-to-4 configuration.

Figure 6:
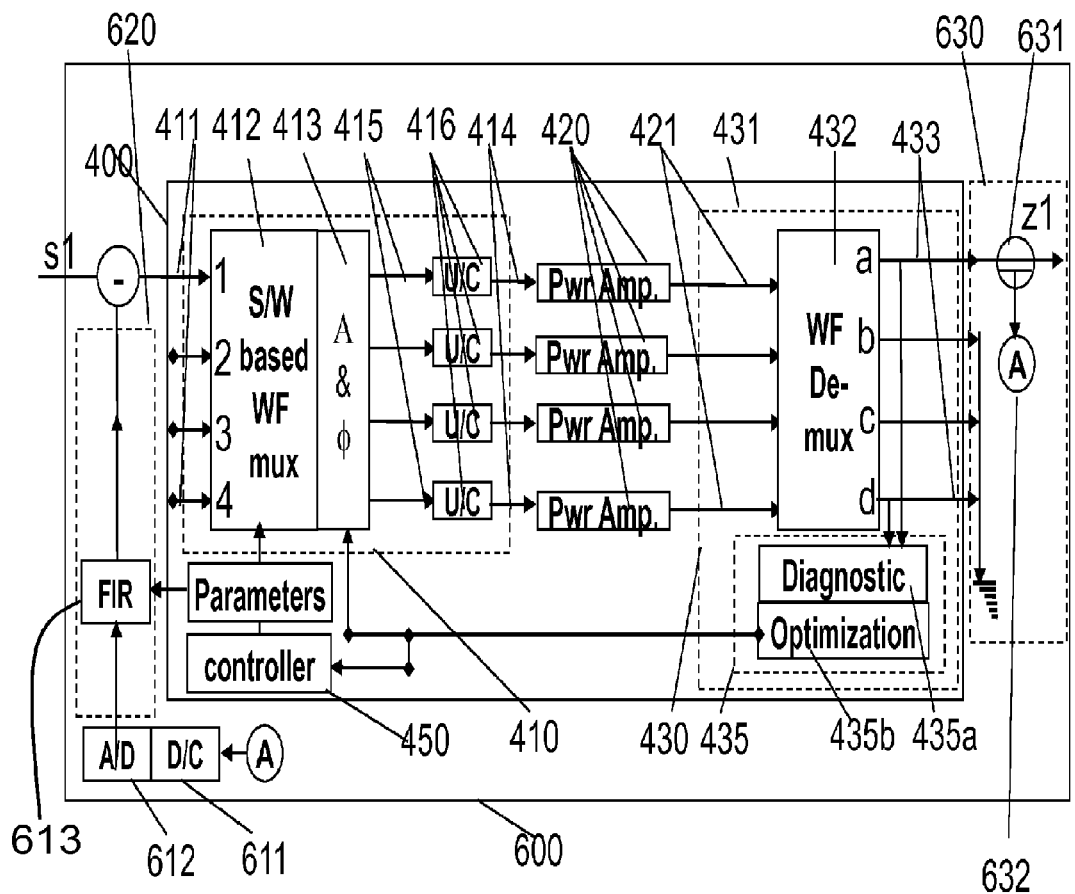
FIG. 6 illustrates a simplified block diagram of an embodiment of the present invention. A bank of 4 PAs is interconnected with a software-based programmable pre-processor with compensation circuits, a bank of power amplifiers, and a post-processor. An adaptive feedback linearlizer is used for gathering feedback signals, which are then fed to a finite impulse response filter for injection back into the signal streams to eliminate signal distortions as a result of phase and alignment shifts.

FIG. 6 600 depicts a technique utilizing 4-to-4 flexible PA module 400 as a high power linear PA with an adaptive feed-back linearizer. It utilizes the PA module a linear amplifier with injection of amplitude and phase controlled feedback signals into individual PAs 420 via the same input port as that of the desired signal $s1(t)$. The controlled injection is modulated by Finite Impulse Response (FIR) filter 613.

The feedback signals are picked up at port a, one of the four outputs 433 of the WF demuxer 432. In addition to the amplified input signals, there are distortions as 3rd and 5th order inner modulations. Picked up RF feedback signals 632 are frequency down converted by a down converter 611 and digitized by an A-to-D converter 612. The digitized signals are properly filtered to eliminate the frequency band of desired signals by a programmable finite impulse response (FIR) filter 613 with adaptively adjusted amplitudes and phases weighting. The weighted feedback signals are then injected into the flexible PA module via a combiner with s1 just before connected to port a.

As a result the inputs to the WM muxer consist of one desired signal streams and a controlled feedback signal to cancel the distortions caused by nonlinearity of individual PAs, especially the 3rd, the 5th, and the 7th order inner modulations.

Figure 6A:
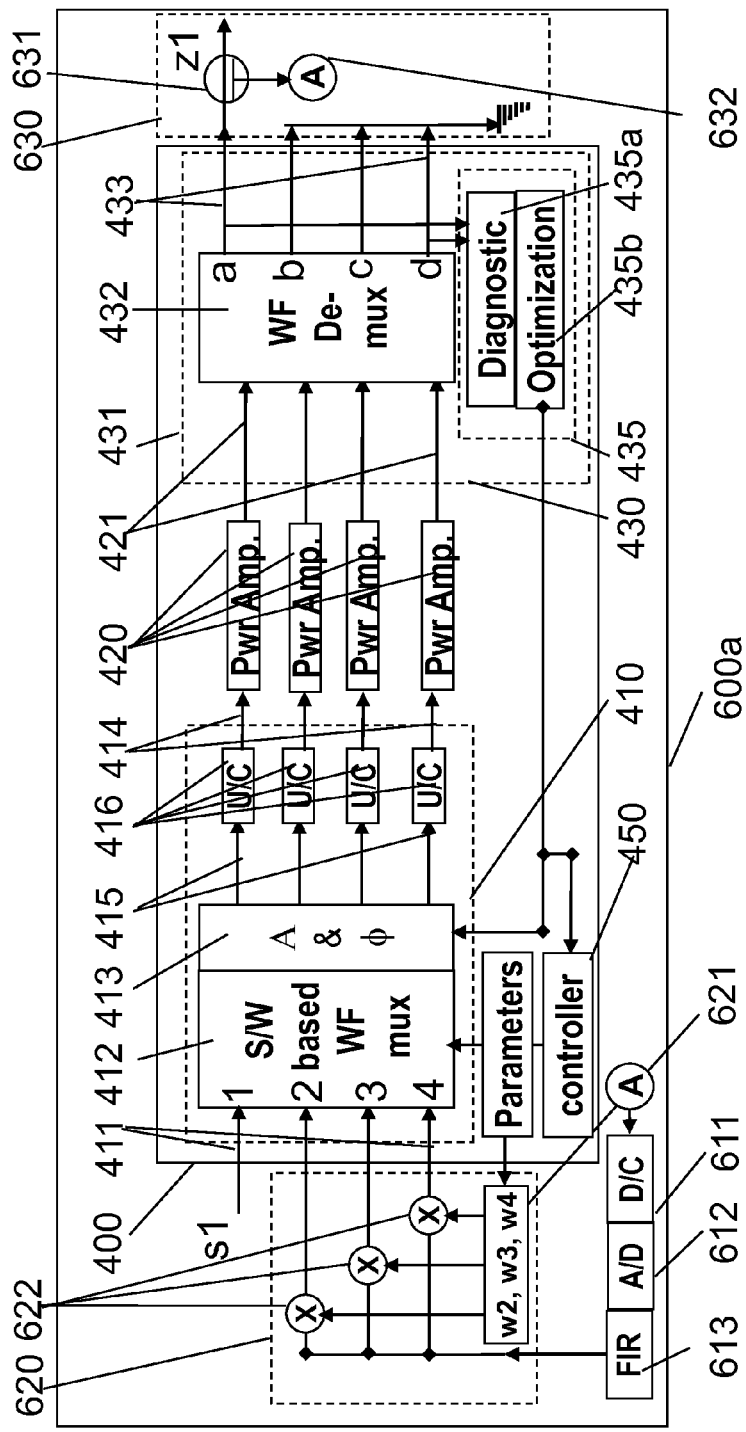
FIG. 6a illustrates a block diagram of an alternative embodiment of the present invention as shown in FIG. 6. A software-based programmable pre-processor is connected to a bank of 4 PAs, which is in turn connected to a post-processor. An adaptive linear feedback unit gathers feedback signals and feeds it to a FIR filter, which then feeds the signals through a complex multiplying processor for signal distortion elimination. These signals are fed back into the pre-processor for increased clarity.

FIG. 6a 600a depicts a techniques to utilize a 4-to-4 flexible PA module 400 as a linear high power PA with adaptive feed-back linearizer. It takes advantage of multiple inputs 411 for injection of amplitude- and phase-controlled feedback signals into individual PAs 420. The desired signal $s1(t)$ is input at port 1.

The feedback signals are picked up at port a, one of the four outputs 433 of WF demuxer 432. In addition to the amplified input signals, there are distortions as 3rd and 5th order inner modulations. The picked up RF feedback signals 632 are frequency down converted by a down converter 611 and digitized by an A-to-D converter 612. The digitized signals are properly filtered to eliminate the frequency band of desired signals by programmable finite impulse response (FIR) filter 613. The filtered feedback signals are replicated in three channels, adaptively weighted via complex multipliers 622 by a set of optimization coefficients w2, w3, and w4. The weighted feedback signals are then injected into the flexible PA module via three remaining ports of the 4 WF muxer inputs 411.

As a result, the inputs to the WM muxer consist of one desired signal streams and three controlled feedback signals to cancel the distortions caused by nonlinearity of individual PAs; especially the 3rd, the 5th, and the 7th order inner modulations.

What is claimed is:

1. A power amplification (PA) module having an interchangeable-output function, comprising:
    a pre-processing unit having a first input, a second input, a first output containing information from said first and second inputs and a second output containing information from said first and second inputs;
    a phase-and-amplitude compensation circuit downstream of said pre-processing unit;
    a first power amplification unit downstream of said phase-and-amplitude compensation circuit;
    a second power amplification unit downstream of said phase-and-amplitude compensation circuit, wherein said first and second power amplification units are arranged in parallel;
    a post-processing unit downstream of said first and second power amplification units, wherein said post-processing unit has a third input, a fourth input, a third output containing information from said third and fourth inputs and a fourth output containing information from said third and fourth inputs, wherein said third output is associated with an amplification of said first input, wherein said fourth output is associated with an amplification of said second input, wherein said post-processing unit comprises a first output port for said third output interchangeable with said fourth output and a second output port for said fourth output interchangeable with said third output; and an optimizer in a signal path between said phase-and-amplitude compensation circuit and said post-processing unit, wherein said optimizer is configured to generate a parameter for said phase-and-amplitude compensation circuit.

2. The power amplification module of claim 1, wherein said first output comprises a linear combination of said first and second inputs, and said second output comprises a linear combination of said first and second inputs.

3. The power amplification module of claim 1, wherein said post-processing unit comprises an RF post-processor.

4. The power amplification module of claim 1, wherein said pre-processing unit comprises a baseband pre-processor.

5. The power amplification module of claim 1, wherein said first input comprises a baseband digital input.

6. The power amplification module of claim 1 further comprising a first frequency-up converter downstream of said phase-and-amplitude compensation circuit and upstream of said first power amplification unit and a second frequency-up converter downstream of said phase-and-amplitude compensation circuit and upstream of said second power amplification unit, wherein said first and second frequency-up converters are arranged in parallel.

7. The power amplification module of claim 1, wherein said first power amplification unit has a fifth input in an analog format.

8. The power amplification module of claim 1 further comprising a controller in a signal path between said pre-processing unit and said post-processing unit, wherein said pre-processing unit is configured to be programmed based on a parameter altered by said controller.

9. A power amplification (PA) module comprising:
a pre-processing unit having a first input, a second input, a first output containing information from said first and second inputs and a second output containing information from said first and second inputs;
a first power amplification unit downstream of said pre-processing unit;
a second power amplification unit downstream of said pre-processing unit, wherein said first and second power amplification units are arranged in parallel;
a post-processing unit downstream of said first and second power amplification units, wherein said post-processing unit has a third input, a fourth input, a third output containing information from said third and fourth inputs and a fourth output containing information from said third and fourth inputs, wherein said third output is associated with an amplification of said first input, wherein said fourth output is associated with an amplification of said second input; and
a finite-impulse-response (FIR) filter in a signal path between said pre-processing unit and said post-processing unit, wherein said finite-impulse-response (FIR) filter is configured to modulate said first input.

10. The power amplification module of claim 9 further comprising a frequency-down converter in said signal path and between said finite-impulse-response (FIR) filter and said post-processing unit, wherein said frequency-down converter is configured to frequency-down convert said third output.

11. The power amplification module of claim 9 further comprising an A-to-D converter in said signal path and between said finite-impulse-response (FIR) filter and said post-processing unit, wherein said A-to-D converter is configured to output a digitalized signal to said finite-impulse-response (FIR) filter, wherein said finite-impulse-response (FIR) filter is configured to eliminate a frequency band of said digitalized signal.

12. The power amplification module of claim 9, wherein said finite-impulse-response (FIR) filter is configured to perform an amplitude-and-phase weighting process so as to create a weighting to be injected into said first input.

13. The power amplification module of claim 9 further comprising a first frequency-up converter downstream of said pre-processing unit and upstream of said first power amplification unit and a second frequency-up converter downstream of said pre-processing unit and upstream of said second power amplification unit, wherein said first and second frequency-up converters are arranged in parallel.

14. The power amplification module of claim 9 further comprising a phase-and-amplitude compensation circuit downstream of said pre-processing unit and upstream of said first and second power amplification units, and an optimizer in a signal path between said phase-and-amplitude compensation circuit and said post-processing unit, wherein said optimizer is configured to generate a parameter for said phase-and-amplitude compensation circuit.

15. The power amplification module of claim 9, wherein said first input comprises a baseband digital input.

16. A power amplification module comprising:
a baseband digital pre-processing unit having a first input, a second input, a first output containing information from said first and second inputs and a second output containing information from said first and second inputs;
a phase-and-amplitude compensation circuit downstream of said baseband digital pre-processing unit;
a first power amplification unit downstream of said phase-and-amplitude compensation circuit;
a second power amplification unit downstream of said phase-and-amplitude compensation circuit, wherein said first and second power amplification units are arranged in parallel;
an RF post-processing unit downstream of said first and second power amplification units, wherein said RF post-processing unit has a third input, a fourth input, a third output containing information from said third and fourth inputs and a fourth output containing information from said third and fourth inputs, wherein said third output is associated with an amplification of said first input, wherein said fourth output is associated with an amplification of said second input; and
an optimizer in a signal path between said phase-and-amplitude compensation circuit and said RF post-processing unit, wherein said optimizer is configured to generate a parameter for said phase-and-amplitude compensation circuit.

17. The power amplification module of claim 16 further comprising a controller in a signal path between said baseband digital pre-processing unit and said RF post-processing unit, wherein said baseband digital pre-processing unit is configured to be programmed based on a parameter altered by said controller.

18. The power amplification module of claim 16, wherein said first power amplification unit has a fifth input in an analog format.

19. The power amplification module of claim 1 further comprising a finite-impulse-response (FIR) filter in a signal path between said pre-processing unit and said post-processing unit, wherein said finite-impulse-response (FIR) filter is configured to modulate said first input.

20. The power amplification module of claim 19 further comprising a frequency-down converter in said signal path and between said finite-impulse-response (FIR) filter and said post-processing unit, wherein said frequency-down converter is configured to frequency-down convert said third output.

21. The power amplification module of claim 19 further comprising an A-to-D converter in said signal path and between said finite-impulse-response (FIR) filter and said post-processing unit, wherein said A-to-D converter is configured to output a digitalized signal to said finite-impulse-response (FIR) filter, wherein said finite-impulse-response (FIR) filter is configured to eliminate a frequency band of said digitalized signal.

22. The power amplification module of claim 19, wherein said finite-impulse-response (FIR) filter is configured to perform an amplitude-and-phase weighting process so as to create a weighting to be injected into said first input.

23. The power amplification module of claim 19 further comprising a multiplier in said signal path and between said finite-impulse-response (FIR) filter and said pre-processing unit, wherein said multiplier is configured to weigh a signal, output from said finite-impulse-response (FIR) filter, by a coefficient so as to form said second input.

* * * * *